US007633317B2

(12) United States Patent
Miranda et al.

(10) Patent No.: US 7,633,317 B2
(45) Date of Patent: Dec. 15, 2009

(54) HIGH-SIDE CURRENT SENSE CIRCUIT WITH COMMON-MODE VOLTAGE REDUCTION

(75) Inventors: Evaldo M. Miranda, Saratoga, CA (US); Anthonius Bakker, Morgan Hill, CA (US)

(73) Assignee: Analog Devices, Inc., Norwood, MA (US)

(*) Notice: Subject to any disclaimer, the term of this patent is extended or adjusted under 35 U.S.C. 154(b) by 63 days.

(21) Appl. No.: 11/804,440

(22) Filed: May 17, 2007

(65) Prior Publication Data

US 2008/0284403 A1 Nov. 20, 2008

(51) Int. Cl.
*G01R 19/00* (2006.01)

(52) U.S. Cl. ............................ 327/51; 327/52; 324/522

(58) Field of Classification Search ................... 327/51, 327/52; 324/522

See application file for complete search history.

(56) References Cited

U.S. PATENT DOCUMENTS 5,012,450 A * 4/1991 Mattausch et al. .......... 365/208
5,602,464 A * 2/1997 Linkowsky et al. ......... 323/272
5,959,574 A * 9/1999 Poore, Jr. ..................... 342/96
6,184,660 B1 * 2/2001 Hatular ....................... 320/141
6,326,771 B1 * 12/2001 Popescu-Stanesti ......... 320/139
6,380,807 B1 4/2002 Brokaw ...................... 330/258
6,617,838 B1 9/2003 Miranda et al. ......... 324/117 R
6,683,479 B2 * 1/2004 Engl .......................... 327/52
2002/0180418 A1 * 12/2002 Jones et al. ................ 324/118
2007/0273409 A1 * 11/2007 Pai ............................ 327/51

OTHER PUBLICATIONS

Analog Devices; "Secondary-Side Controller With Current Share and Housekeeping" ; ADM1041; Rev. A; pp. 1-64.

* cited by examiner

*Primary Examiner*—Lincoln Donovan
*Assistant Examiner*—Ryan C Jager
(74) *Attorney, Agent, or Firm*—Koppel, Patrick, Heybl & Dawson

(57) ABSTRACT

A high-side current sense circuit comprises a sense resistance $R_{sense}$ connected in series with a signal having an associated current to be measured I, which develops voltages V1 and V2 on either side of $R_{sense}$. A differential gain stage powered by supply voltages VCC and VEE produces an output voltage which varies with the difference between its input signals. To keep the common mode portion of the input signal between voltages VCC and VEE, a voltage modification circuit subtracts or adds a common mode voltage to or from V1 and V2 to produce modified voltages V1' and V2', which are coupled to the gain stage inputs. The voltage modification circuit is arranged to ensure that VEE≦V1' and V2'≦VCC.

18 Claims, 4 Drawing Sheets

HIGH-SIDE CURRENT SENSE CIRCUIT WITH COMMON-MODE VOLTAGE REDUCTION

BACKGROUND OF THE INVENTION

1. Field of the Invention

This invention relates generally to the field of current sense circuits, and more particularly to high-side current sense circuits.

2. Description of the Related Art

There are numerous applications in which it is necessary to measure a particular current in a circuit. For example, it is often desirable to know the current consumed by a circuit. This could be determined by sensing the current on the "high-side" of the circuit—i.e., where a non-zero supply voltage is connected to the circuit, or on the circuit's "low-side"—i.e., where the current returns to its source.

When measuring a high-side current, the signal of interest has a non-zero DC voltage component which can prove problematic for some current measurement circuits. An example of this is illustrated with the circuit shown in FIG. 1, which measures the current using a sense resistor having a resistance $R_{sense}$ connected in series with the signal whose current (I) is to be measured. Current I causes voltages V2 and V1 to be developed on either side of $R_{sense}$, which are provided to the inputs of a differential amplifier A1 powered by supply voltages VCC and VEE. When configured as shown, the output ($V_o$) of the amplifier is given by:

$$V_o=(Rb/Ra)(V2-V1)=I*R_{sense}(R2/R1).$$

The voltage $I*R_{sense}$ is differentially measured and amplified by Rb/Ra. The common mode voltage at the input of A1 is given by:

$$V+=V-=V2[Rb/(Ra+Rb)].$$

Ideally, the voltages V+ and V− at the input of the amplifier are within the range of its power rails VCC and VEE. However, if the voltages V1 and/or V2 are outside the power rails, the ratio Rb/Ra may be forced to be less than 1, which in turn forces the output voltage ($V_o$) and the measured current value to be reduced. This general approach is used, for example, in the ADM1041 Secondary-Side Controller with Current Share and Housekeeping IC from Analog Devices, Inc., and is also discussed in U.S. Pat. No. 6,617,838 to Miranda et al.

SUMMARY OF THE INVENTION

A high-side current sense circuit is presented which overcomes the problems noted above, in that the common-mode voltage applied to the input of a gain stage is reduced as needed to keep it between the stage's power rails, while having little to no impact on the magnitude of the gain stage's output voltage ($V_o$) or the measured current value.

The present high-side current sense circuit comprises a sense resistor having a resistance $R_{sense}$ for connection in series with an input signal having an associated current to be measured I and a non-zero DC voltage component. $R_{sense}$ conducts I, and as a result voltages V1 and V2 are developed on either side of $R_{sense}$. The circuit also includes a differential gain stage powered by supply voltages VCC and VEE, which produces an output voltage $V_o$ which varies with the difference between between its input signals.

To keep the common mode portion of the gain stage's input signal between rail voltages VCC and VEE, a voltage modification circuit is employed which subtracts (if the common mode voltage is above VCC) or adds (if the common mode voltage is below VEE) a common mode voltage to or from both V1 and V2. This produces modified voltages V1' and V2' at first and second nodes, respectively, to which the inputs of the differential gain stage are coupled. The voltage modification circuit is arranged to ensure that VEE≦V1' and V2'≦VCC. The current sense circuit is arranged such that the output $V_o$ of the gain stage is proportional to $I*R_{sense}$.

The voltage modification circuit preferably comprises a first resistor connected between V1 and a first node and a second resistor connected between V2 and a second node, and first and second current sources connected to conduct respective currents through the resistors. The voltages developed across the resistors are subtracted (or added) to V1 and V2, such that the resulting voltages (V1' and V2') are between VCC and VEE. The current sources are preferably made such that their currents vary with the common mode portion of V1 and V2, so that V1' and V2' remain between VCC and VEE over time.

These and other features, aspects, and advantages of the present invention will become better understood with reference to the following drawings, description, and claims.

DETAILED DESCRIPTION OF THE INVENTION

Figure 1:
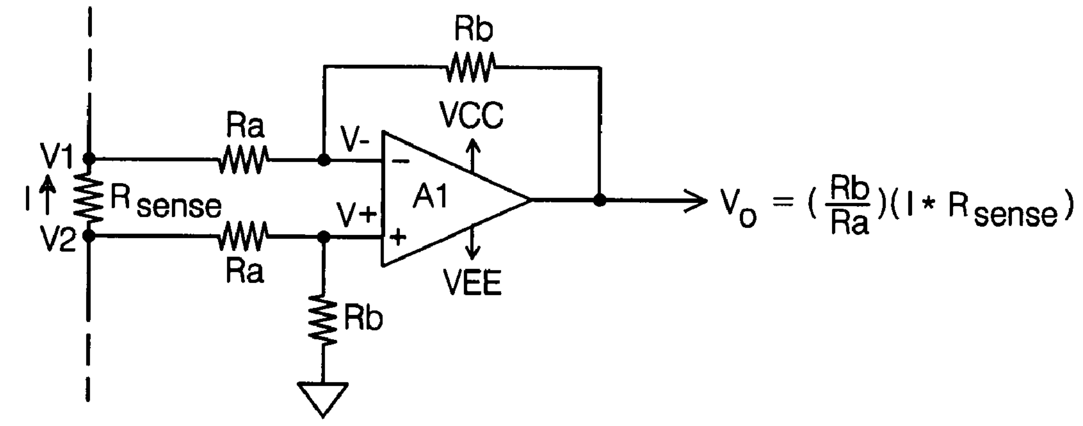
FIG.1 (Prior Art)
FIG. 1 is schematic diagram of a known high-side current sense circuit.

The present invention is for use with a sensing element having a resistance $R_{sense}$, which conducts a current (I) to be measured. The present current sense circuit provides a means for measuring differential voltage $I*R_{sense}$ when the common mode portion of the voltages across $R_{sense}$ are above or below the power rails of the measuring circuit, while having a minimal effect on the measured voltage. This is accomplished by adding or subtracting a common mode voltage from both of the voltages across $R_{sense}$.

One way in which this may be accomplished is shown in FIG. 2. As before, a sense resistor with resistance $R_{sense}$ is connected in series with a signal 20 such that it conducts the signal's current I, causing voltages V2 and V1 to develop on either side of $R_{sense}$. A differential gain stage 22 is powered by first and second supply voltages VCC and VEE (such that VCC>VEE; VEE may be at ground potential), and is arranged to produce an output $V_o$ which varies with the difference between the signals presented at its inputs.

In this exemplary embodiment, the concern is that the common mode portion of V1 and V2 may be greater than VCC. To avoid this, a voltage modification circuit 24 is arranged to subtract a common mode voltage from both V1 and V2, to produce modified voltages V1' and V2' at first and second nodes (26 and 28), respectively. Differential gain stage 22 is then coupled at its inputs to nodes 26 and 28.

Voltage modification circuit 22 includes first and second resistors having resistances R1 and R2, with R1 connected between V1 and node 26 and R2 connected between V2 and node 28, and first and second current sources 30 and 32 connected to nodes 26 and 28 respectively. Current sources 30 and 32 conduct currents $I_{CM1}$ and $I_{CM2}$, which flow through R1 and R2, respectively. R1 and R2 are preferably made equal, as are $I_{CM1}$ and $I_{CM2}$. When so arranged, a common mode voltage $V_{CM}$ is subtracted from V2 and V1, as follows:

$$I*R_{sense}=(V2-V_{CM})-(V1-V_{CM}),\text{ where } V_{CM}=R1*I_{CM1}.\text{ Then,}$$

$$V2'=V2-V_{CM}\text{ and }V1'=V1-V_{CM};$$

$$I*R_{sense}=(V2-V1)-VCM+VCM;\text{ and}$$

$$I*R_{sense}=(V2-V1).$$

Thus, by subtracting a common mode voltage from both sides of the sensing element, voltages V2' and V1' are reduced from V1 and V2 by R1*$I_{CM1}$. However, the differential voltage measured at the sensing element remains relatively unchanged if I>>$I_{CM1}$. Thus, V2'–V1' is also given by I*$R_{sense}$.

Gain stage 22 receives V2' and V1' at its inputs. When properly arranged, voltage modification circuit 24 ensures that:

VEE≦V1' and V2'≦VCC, and gain stage 22 produces an output $V_o$=Gain*(I*$R_{sense}$).

Figure 2A:
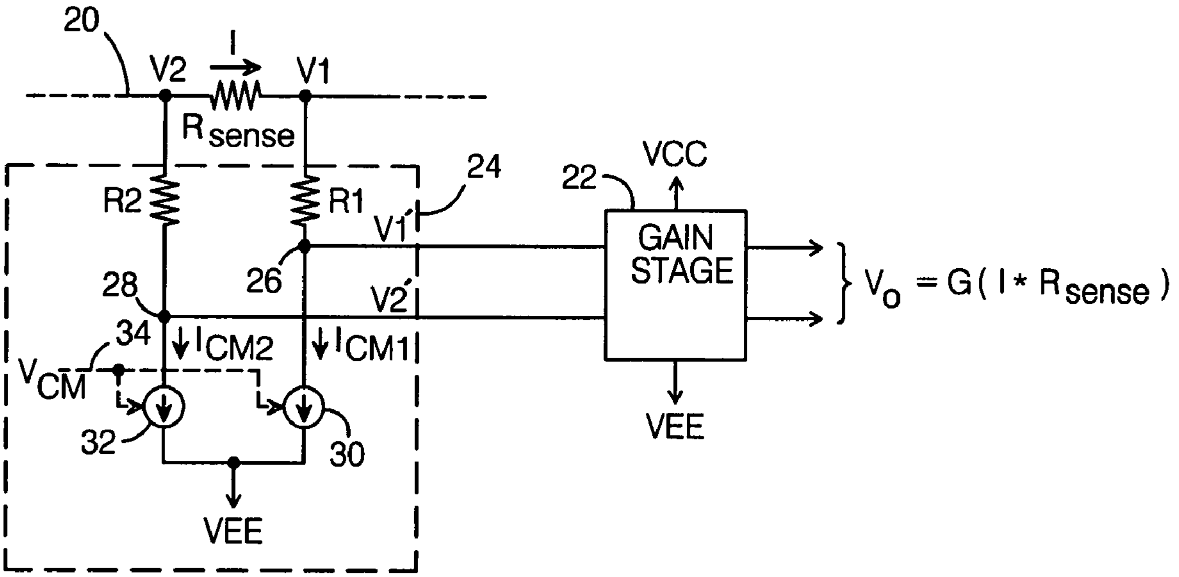
FIG. 2*a* is block/schematic diagram of one possible embodiment of a high-side current sense circuit in accordance with the present invention.
Figure 2B:
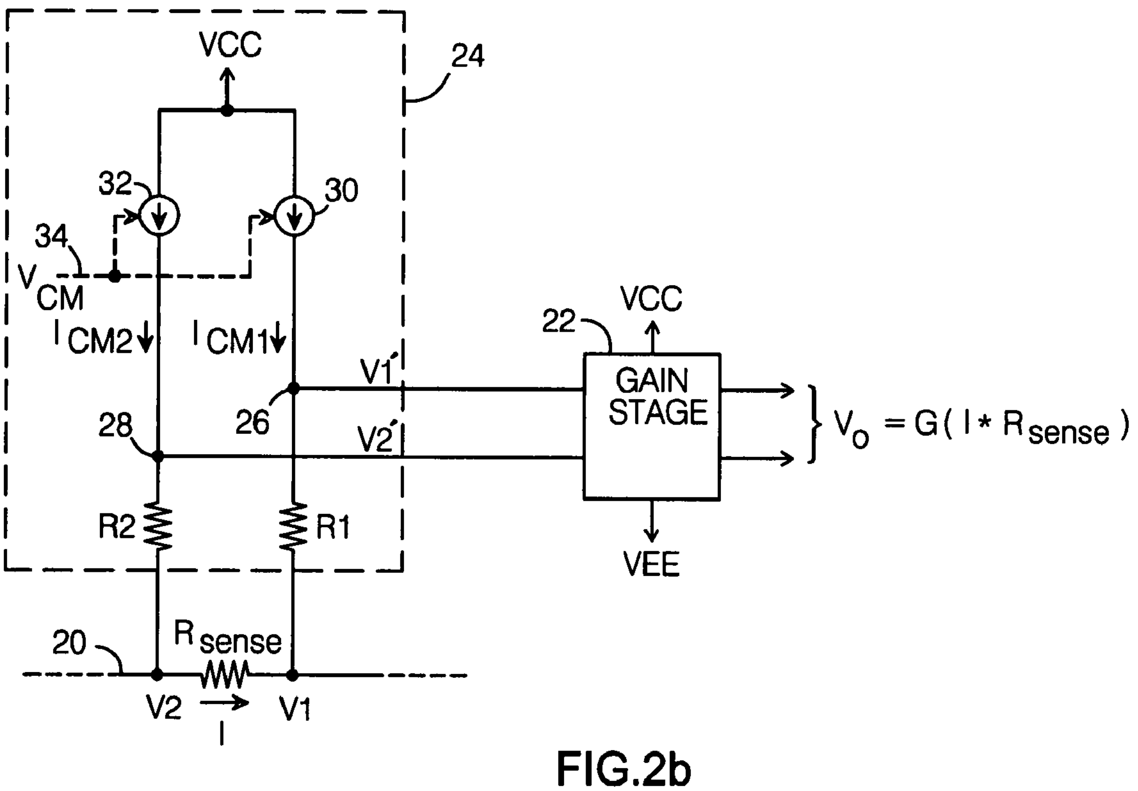
FIG. 2*b* is block/schematic diagram of another possible embodiment of a high-side current sense circuit in accordance with the present invention.

The present invention can also be employed when the concern is that the common mode portion of V1 and V2 may be less than VEE. In this case, an embodiment as shown in FIG. 2*b* could be used. Here, voltage modification circuit 24 is arranged to add a common mode voltage $V_{CM}$ to V2 and V1 to bias V2' and V1' within the VCC and VEE rails.

In some applications, the current sense circuit might include both the voltage modification circuit of FIG. 2*a* and the voltage modification circuit of FIG. 2*b*, and be arranged so that a user could choose to use either one depending on whether the DC voltage component of the current being sensed across $R_{sense}$ is below VEE or above VCC. Alternatively, an IC could include just one polarity of voltage modification circuit, which would conserve space on the die.

The common mode portion of voltages V2 and V1 may vary over time. In order to accurately remove this varying common mode voltage, current sources 30 and 32 need to respond to changes in the common mode voltage. Thus, the current sources are preferably made variable; this is illustrated in FIGS. 2*a* and 2*b* with a control signal 34 which varies with $V_{CM}$ provided to current sources 30 and 32, which are arranged to vary their outputs in response.

One possible implementation which includes variable current sources as described above is shown in FIG. 3. Here, current sources 30 and 32 are implemented with respective transistors MN1 and MN2, which conduct $I_{CM1}$ and $I_{CM2}$, respectively. An error amplifier 36 receives a reference voltage $V_{ref}$ at one input, and is coupled to a node which varies with the common mode portion of V1 and V2—node 28 in this exemplary embodiment—at its other input. The output of amplifier 36 serves as control signal 34, and is connected to drive MN1 and MN2.

Assuming amplifier 36 is ideal:

$$V2'=V_{ref},\text{ and}$$

$$I_{CM2}=(V2-V_{ref})*R2.$$

The current in MN2 ($I_{CM2}$) is mirrored to MN1, so that $I_{CM2}=I_{CM1}=I_{CM}$ (assuming that MN1 and MN2 are equally sized). Assuming that R1=R2, this results in a common mode voltage of R2*$I_{CM}$ being subtracted equally from V2 and V1, such that V2'–V1'=I*$R_{sense}$.

Note that though current sources 30 and 32 are shown as implemented with NMOS FETs, other transistor types, such as bipolar transistors, could also be used. Also note that error amplifier 36 could be connected to nodes other than node 28; it is only necessary that the node to which it is connected varies with the common mode portion of V1 and V2. Reference voltage $V_{ref}$ should be set as needed to ensure that V1' and V2' are between the power rails of gain stage 22.

A chopping circuit 40 can be connected between nodes 26, 28 and transistors MN1 and MN2. When the chopping circuit is in a first mode, node 26 is connected to MN1 and node 28 is connected to MN2. When in a second mode, node 28 is connected to MN1 and node 26 is connected to MN2. Chopping circuit 40 is arranged to alternate between its first and second modes so as to reduce errors in the average value of $V_o$ that arise due to mismatches between the first and second transistors.

The output $V_o$ of gain stage 22 is typically fed to the analog input of an analog-to-digital converter (ADC) 42, which converts $V_o$ to a digital value during a conversion cycle. When so arranged, chopping circuit 40 preferably is in its first mode during one conversion cycle, and in its second mode during the subsequent conversion cycle. The average of the two conversions is then computed to cancel out errors due to mismatches between MN1 and MN2, assuming that the sensing signal (I*$R_{sense}$) and the common mode voltage do not change considerably between the first and second conversion cycles.

Figure 3:
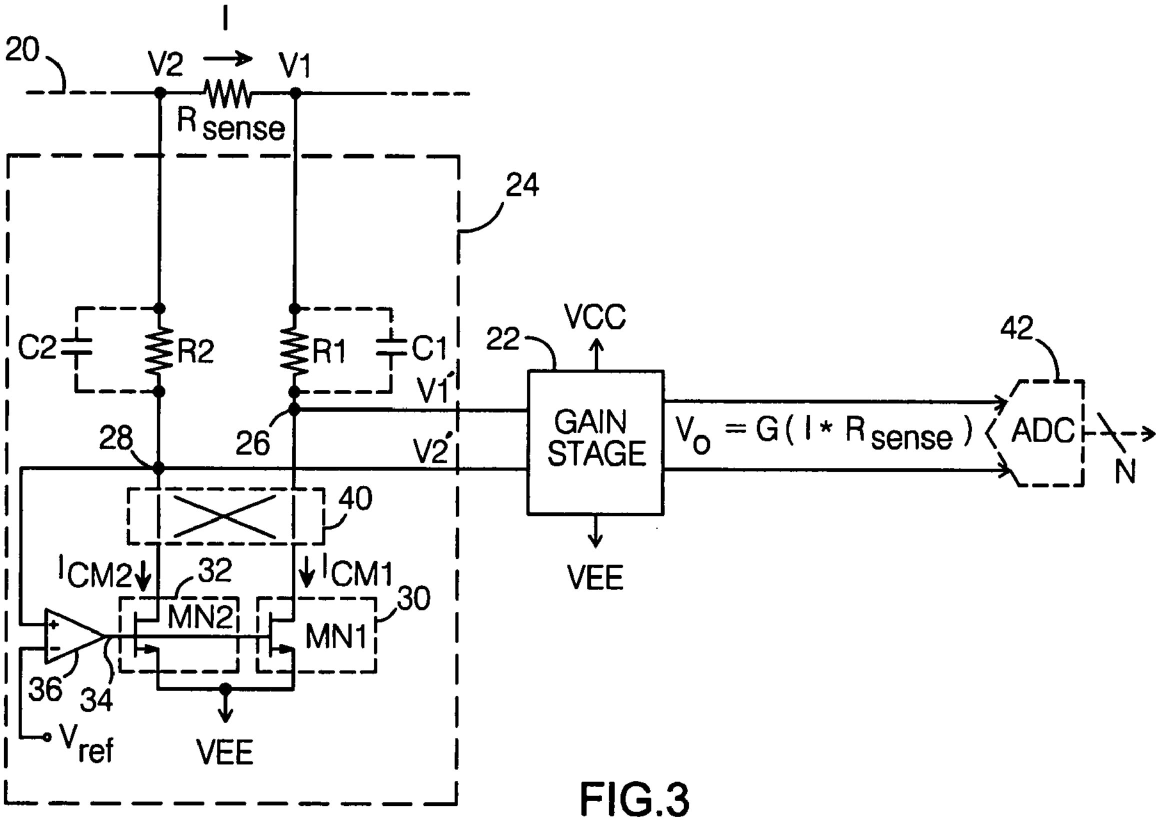
FIG. 3 is block/schematic diagram of another possible embodiment of a high-side current sense circuit in accordance with the present invention.

Generally, voltages V2 and V1 have a large DC component and a small differential AC component which is actually dominated by current signal I. As such, it may be desirable to AC couple signal 20 to nodes 26 and 28. This is illustrated in FIG. 3 with capacitors C1 and C2, connected across resistances R1 and R2, respectively. Assuming R1//C1=R2//C2, voltages V1 and V2 are AC-coupled differentially into the inputs of gain stage 22.

In the current sense circuit shown in FIG. 3, the input impedance at the V2' node is lower than that at the V1' node. This is due to the amplifier gain and the closed loop configuration around the V2' node, assuming that the input impedance of gain stage 22 is high. This mismatch in input impedances may cause the differential signal between V2' and V1' to be distorted over frequency compared to the actual I*$R_{sense}$ signal.

Figure 4:
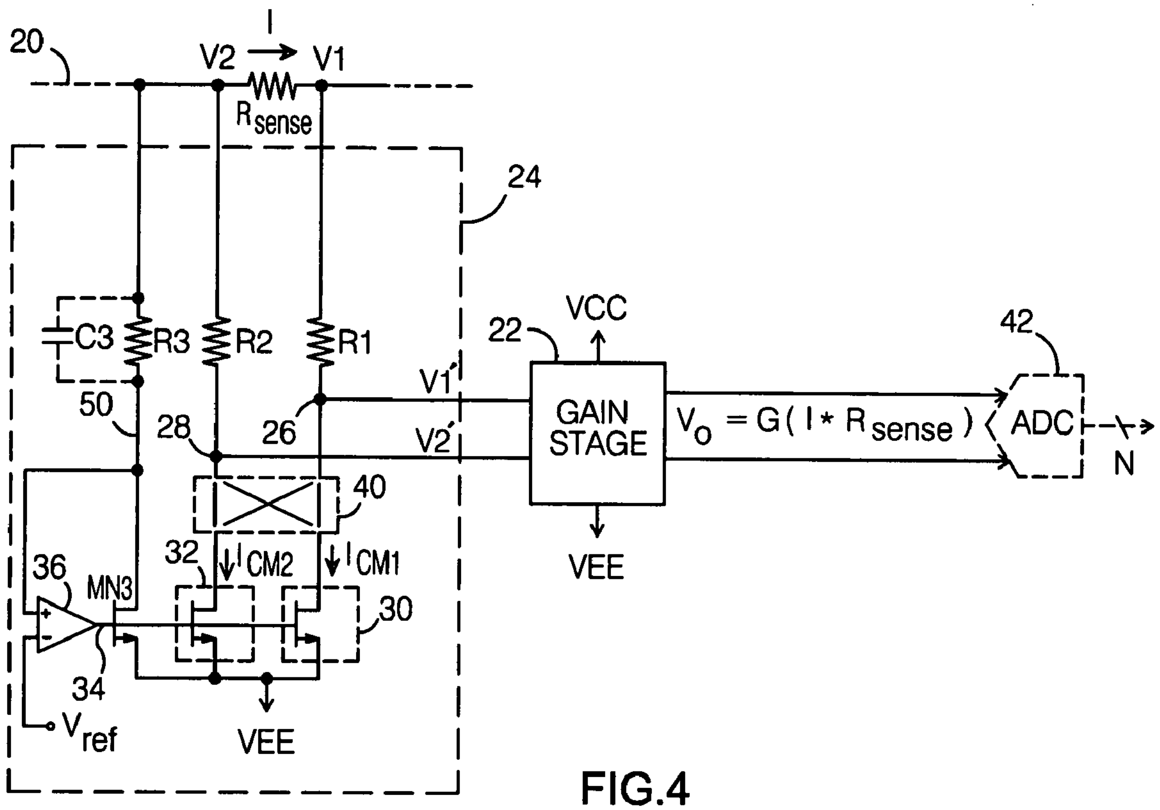
FIG. 4 is block/schematic diagram of another possible embodiment of a high-side current sense circuit in accordance with the present invention.

One way in which this mismatch can be addressed is shown in FIG. 4. Here, a resistor having a resistance R3 is connected between voltage V2 and a node 50, a transistor MN3 is connected to node 50 and driven in parallel with MN2 and MN1, and the input of amplifier 36 is connected to node 50, rather than to node 28 as in FIG. 3. Resistance R3 is preferably made equal to R1 and R2, and MN3 is preferably the same size as MN1 and MN2. Now, the loop is no longer closed around V2', thereby enabling the impedances at V2' and V1' to be better matched. Note that, as in FIG. 3, a chopping circuit 40 could be included as shown to reduce mismatch errors.

Figure 5:
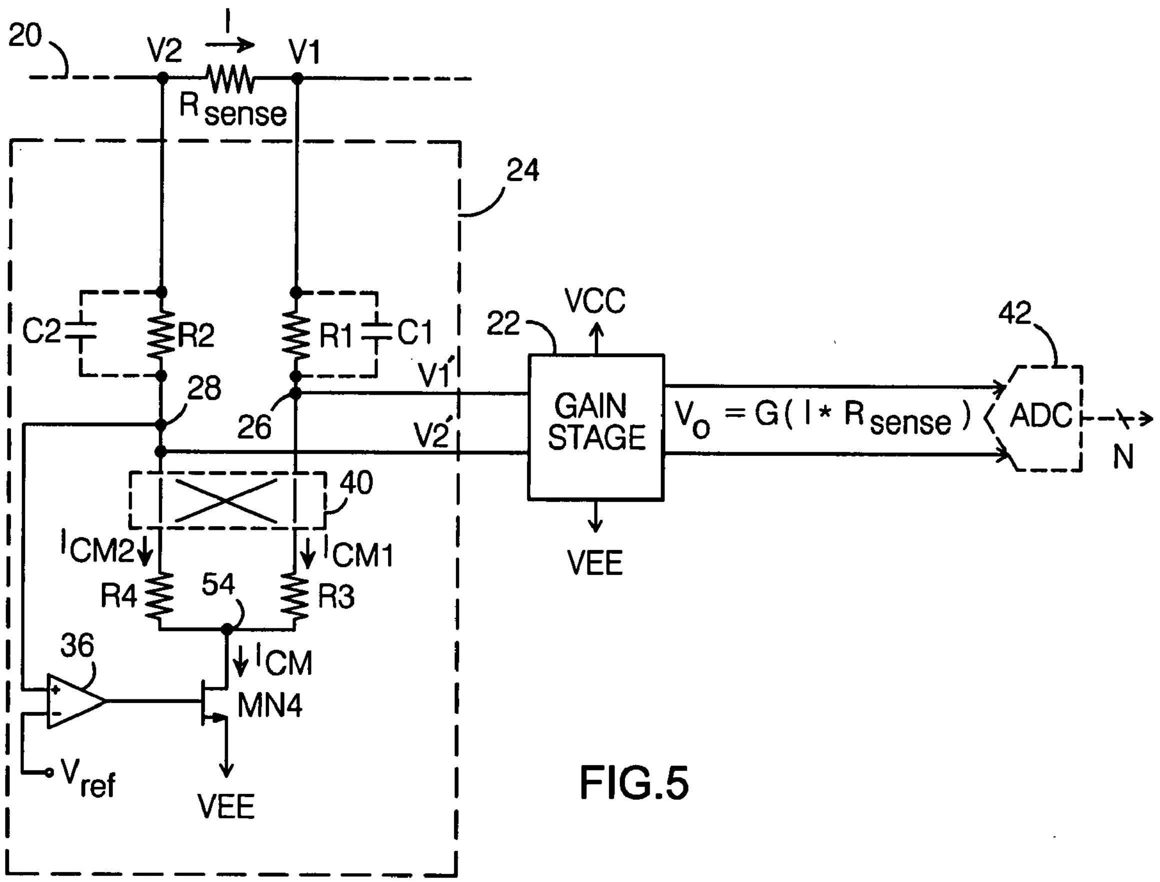
FIG. 5 is block/schematic diagram of another possible embodiment of a high-side current sense circuit in accordance with the present invention.

Another possible implementation of voltage modification circuit 24 is shown in FIG. 5. Here, the two transistors that were employed as current sources in FIG. 4 are replaced with a transistor MN4, a resistor having a resistance R3 is connected between node 26 and MN4, and a resistor having a resistance R4 is connected between node 28 and MN4; the junction of R3, R4 and MN4 is a node 54. MN4 is driven by amplifier 36, with the result being that $I_{CM1}$ is conducted by R3 and $I_{CM2}$ is conducted by R4.

This arrangement uses only a single transistor to provide a current source, but increases the number of resistors, making it more sensitive to mismatches between R1//C1 and R2//C2. Chopping switches are preferably included to reduce the mismatch between R3 and R4. As above, a chopping circuit 40 could be inserted between nodes 26,28 and R3,R4 to reduce mismatch errors.

Figure 6:
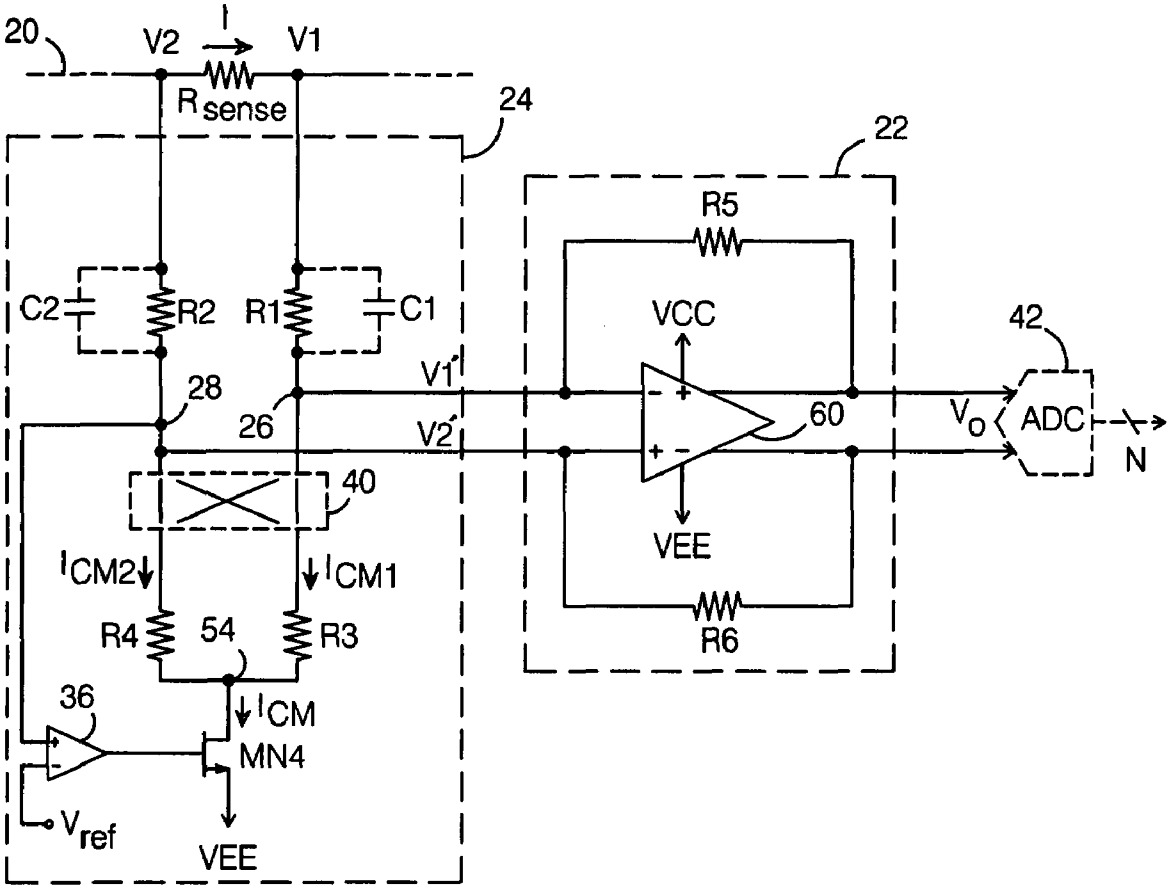
FIG. 6 is block/schematic diagram of another possible embodiment of a high-side current sense circuit in accordance with the present invention.

Note that in FIG. 5, V2' is not equal to V1'. However, the gain stage 22 of FIG. 5 can be modified as shown FIG. 6. Here, gain stage 22 comprises a differential amplifier 60, having a feedback resistor with a resistance R5 connected between its non-inverting output and its inverting input, and a feedback resistor with a resistance R6 connected between its inverting output and its non-inverting input. When so arranged, the impedance seen at V2' and V1' is defined by R5 and R6. In this configuration, voltages V2' and V1' are driven to be nearly equal by amplifier 60, while forcing the currents in R3 and R4 to be equal (assuming R3=R4).

With V2'=V1' and R3=R4, the common mode current is $I_{CM}=I_{CM1}=I_{CM2}=(V_{ref}-V_{54})/R4$, and $I_{R1}=I_{R4}=I_{CM}$, where $V_{54}$ is the voltage at node 54, and $I_{R1}$ and $I_{R4}$ are the currents in R1 and R4, respectively. Then, the gain G is given by:

$$G=R5/R1=R6/R2.$$

Thus, the overall output voltage $V_o$ is given by:

$V_o=(R5/R1)*I*R_{sense}$. This circuit reduces the common mode voltage at the input of differential amplifier 60 so that V1' and V2' can be between VEE and VCC, while gaining the differential signal ($I*R_{sense}$).

Note that, as an alternative to using an ADC, the differential output of amplifier 60 can be fed to a differential to single-ended amplifier and then filtered to remove the ripple from any chopping circuits which are employed.

Note that the embodiments described herein are merely exemplary—there are numerous ways in which a current sense circuit in accordance with the present invention could be implemented. It is only essential that a voltage modification circuit be employed to add or subtract a common mode voltage to or from the voltages (V1,V2) developed on either side of a sense element carrying a current to be measured, with the modified voltages (V1',V2') provided to the inputs of a differential gain stage such that VEE≦V1' and V2'≦VCC, where VEE and VCC are the gain stage's supply voltages.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A high-side current sense circuit, comprising:

a sense resistor having a resistance $R_{sense}$ for connection in series with an input signal having an associated current I and a non-zero DC voltage component such that said sense resistance conducts said current I, said input signal developing voltages V1 and V2 on either side of said sense resistance;

a differential gain stage powered by first and second fixed supply voltages VCC and VEE, respectively, where VCC>VEE, said gain stage producing an output $V_o$ which varies with the difference between the signals presented at its inputs; and a voltage modification circuit comprising:

a first resistor having a resistance R1 connected between V1 and a first node;

a second resistor having a resistance R2 connected between V2 and a second node;

a first current source which provides a current $I_{CM1}$ connected between said first node and said supply voltage VEE; and a second current source which provides a current $I_{CM2}$ connected between said second node and said supply voltage VEE, said first and second resistors and current sources arranged such that R1 is approximately equal to R2 and $I_{CM1}$ is approximately equal to $I_{CM2}$;

such that:

$$V1'=V1-V_{CM1}, \text{ and}$$

$$V2'=V2-V_{CM2};$$

where $V_{CM1}=I_{CM1}*R1$ and $V_{CM2}=I_{CM2}*R2$ and V1' and V2' are the voltages at said first and second nodes, respectively;

said differential gain stage connected at its inputs to said first and second nodes, said voltage modification circuit arranged such that:

VEE≦V1' and V2'≦VCC, and said gain stage and voltage modification circuit arranged such that:

$$V_o \alpha I*R_{sense}.$$

2. The current sense circuit of claim 1, wherein said current sources are arranged to vary $I_{CM1}$ and $I_{CM2}$ with the common mode voltage portion of V1 and V2 such that V1' and V2' remain between VCC and VEE.

3. The current sense circuit of claim 2, wherein said first and second current sources comprise:

first and second transistors connected to conduct $I_{CM1}$ and $I_{CM2}$, respectively, in response to respective drive signals; and an error amplifier, the inputs of which are coupled to a reference voltage $V_{ref}$ and a voltage which varies with V1 or V2, the output of said amplifier providing said drive signals to said transistors such that $I_{CM1}$ and $I_{CM2}$ vary with the common mode voltage portion of V1 and V2.

4. The current sense circuit of claim 3, wherein the inputs of said amplifier are coupled to $V_{ref}$ and V2', such that said amplifier forces V2'≈$V_{ref}$ and $$I_{CM2} \approx (V2-V_{ref})*R2.$$

5. The current sense circuit of claim 3, further comprising a chopping circuit connected between said first and second nodes and said first and second transistors such that, when said chopping circuit is in a first mode said first node is connected to said first transistor and said second node is connected to said second transistor, and when in a second mode said second node is connected to said first transistor and said first node is connected to said second transistor, said chopping circuit arranged to alternately operate in said first and second modes so as to reduce errors in the average value of $V_o$ that arise due to mismatches between said first and second transistors.

6. The current sense circuit of claim 5, further comprising an analog-to-digital converter arranged to convert $V_o$ from an analog voltage to a digital value during a conversion cycle, said current sense circuit arranged such that said chopping circuit operates in said first mode during a first conversion cycle and in said second mode during a second conversion cycle, the results of said first and second conversion cycles averaged together to reduce errors that arise due to mismatches between said first and second transistors.

7. The current sense circuit of claim 3, further comprising:

a third resistor having a resistance R3 connected between V2 and a third node; and a third transistor connected to said third node and driven by the output of said amplifier to conduct the current in said third resistor;

said amplifier input connected to a voltage which varies with V1 or V2 connected to said third node.

8. The current sense circuit of claim 7, further comprising a capacitor connected across said third resistor such that AC components in said input signal are AC-coupled to said third node.

9. The current sense circuit of claim 2, wherein said first and second current sources comprise:

a third resistor having a resistance R3 connected between said first node and a third node;

a fourth resistor having a resistance R4 connected between said second node and said third node;

a transistor connected to said third node such that said third and fourth resistors conduct $I_{CM1}$ and $I_{CM2}$, respectively, and said transistor conducts $I_{CM1}+I_{CM2}$, in response to a drive signal; and an error amplifier, the inputs of which are coupled to a reference voltage $V_{ref}$ and a voltage which varies with V1 or V2, the output of said amplifier providing said drive signal to said transistor such that $I_{CM1}$ and $I_{CM2}$ vary with the common mode voltage portion of V1 and V2.

10. The current sense circuit of claim 9, further comprising a chopping circuit connected between said first and second nodes and said third and fourth resistors such that, when said chopping circuit is in a first mode said first node is connected to said third resistor and said second node is connected to said fourth resistor, and when in a second mode said second node is connected to said first resistor and said first node is connected to said second resistor, said chopping circuit arranged to alternately operate in said first and second modes so as to reduce errors in the average value of $V_o$ that arise due to mismatches between said third and fourth resistors.

11. The current sense circuit of claim 10, further comprising an analog-to-digital converter arranged to convert $V_o$ from an analog voltage to a digital value during a conversion cycle, said current sense circuit arranged such that said chopping circuit operates in said first mode during a first conversion cycle and in said second mode during a second conversion cycle, the results of said first and second conversion cycles averaged together to reduce errors that arise due to mismatches between said third and fourth resistors.

12. The current sense circuit of claim 9, wherein said differential gain stage has differential inputs and differential outputs, further comprising a first feedback resistor connected between said amplifier's non-inverting output and its inverting input, and a second feedback resistor connected between said amplifier's inverting output and its non-inverting input, such that the impedance seen at said first and second nodes is defined by said feedback resistors.

13. The current sense circuit of claim 1, further comprising:

a first capacitor having a capacitance C1 connected across said first resistor, and a second capacitor having a capacitance C2 connected across said second resistor, such that AC components in said input signal are AC-coupled to said first and second nodes.

14. The current sense circuit of claim 1, wherein said first current source is connected between said first node and VEE and said second current source is connected between said second node and VEE, and said voltage modification circuit is arranged to subtract a common mode voltage from both V1 and V2 to produce modified voltages V1' and V2' at said first and second nodes, respectively, such that: VEE≦V1' and V2'≦VCC, further comprising:

a second voltage modification circuit arranged to add a common mode voltage to both V1 and V2 to produce modified voltages V1' and V2' at first and second nodes, respectively, said second voltage modification circuit comprising:

a third resistor having a resistance R3 connected between V1 and said first node;

a fourth resistor having a resistance R4 connected between V2 and said second node;

a third current source which provides a current $I_{CM3}$ connected between said first node and VCC; and a fourth current source which provides a current $I_{CM4}$ connected between said second node and VCC;

such that:

$$V1' = V1 + V_{CM3}, \text{ and}$$

$$V2' = V2 + V_{CM4},$$

where $V_{CM3}=I_{CM3}$*R3 and $V_{CM4}=I_{CM4}$*R4.

15. The current sense circuit of claim 14, wherein said circuit is arranged such that a user can enable either one of said voltage modification circuits and disable the other of said voltage modification circuits.

16. The current sense circuit of claim 1, wherein $I_{CM1}$ and $I_{CM2}$ vary with a single control voltage.

17. The current sense circuit of claim 16, wherein said single control voltage is the voltage at one of said first and second nodes.

18. A high-side current sense circuit, comprising:

a sense resistor having a resistance $R_{sense}$ for connection in series with an input signal having an associated current I and a non-zero DC voltage component such that said sense resistance conducts said current I, said input signal developing voltages V1 and V2 on either side of said sense resistance;

a differential gain stage powered by first and second fixed supply voltages VCC and VEE, respectively, where VCC>VEE, said gain stage producing an output $V_o$ which varies with the difference between the signals presented at its inputs; and a voltage modification circuit comprising:

a first resistor having a resistance R1 connected between V1 and a first node;

a second resistor having a resistance R2 connected between V2 and a second node;

a first current source which provides a current $I_{CM1}$ connected between said first node and said fixed supply voltage VCC; and a second current source which provides a current $I_{CM2}$ connected between said second node and said fixed supply voltage VCC, said first and second resistors and current sources are arranged such that R1 is approximately equal to R2 and $I_{CM1}$ is approximately equal to $I_{CM2}$;

such that:

$$V1' = V1 + V_{CM1}, \text{ and}$$

$$V2' = V2 + V_{CM2};$$

where $V_{CM1} = I_{CM1} * R1$ and $V_{CM2} = I_{CM2} * R2$ and V1' and V2' are the voltages at said first and second nodes, respectively;

said differential gain stage connected at its inputs to said first and second nodes, said voltage modification circuit arranged such that:

VEE≦V1' and V2'≦VCC, and said gain stage and voltage modification circuit arranged such that:

$$V_o \alpha I * R_{sense}.$$

* * * * *